(12) United States Patent
Loh et al.

(10) Patent No.: US 12,501,657 B2
(45) Date of Patent: Dec. 16, 2025

(54) SELECTIVE SILICIDE FOR STACKED MULTI-GATE DEVICE

(71) Applicant: Taiwan Semiconductor Manufacturing Company, Ltd., Hsinchu (TW)

(72) Inventors: Wei-Yip Loh, Hsinchu (TW); Hong-Mao Lee, Hsinchu (TW); Harry Chien, Chandler, AZ (US); Chih-Wei Chang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 390 days.

(21) Appl. No.: 18/323,587

(22) Filed: May 25, 2023

(65) Prior Publication Data

US 2024/0297228 A1 Sep. 5, 2024

Related U.S. Application Data

(60) Provisional application No. 63/487,667, filed on Mar. 1, 2023.

(51) Int. Cl.
*H01L 29/417* (2006.01)
*H01L 21/8238* (2006.01)
(Continued)

(52) U.S. Cl.
CPC ....... *H10D 30/6729* (2025.01); *H10D 30/014* (2025.01); *H10D 30/024* (2025.01);
(Continued)

(58) Field of Classification Search
CPC .... H10D 30/014; H10D 30/024; H10D 30/43; H10D 30/62; H10D 30/6211;
(Continued)

(56) References Cited

U.S. PATENT DOCUMENTS 11,532,627 B2   12/2022  Liao
2021/0366907 A1* 11/2021  Liao ................... H10D 84/8311
(Continued)

FOREIGN PATENT DOCUMENTS

TW          202127526 A    7/2021
TW          202228297 A    7/2022

*Primary Examiner* — David C Spalla
(74) *Attorney, Agent, or Firm* — HAYNES AND BOONE, LLP

(57) ABSTRACT

Semiconductor structures and methods of forming the same are provided. A method of the present disclosure includes receiving a workpiece that includes a bottom source/drain feature over a substrate, a first dielectric layer over the bottom source/drain feature, a top source/drain feature over the first dielectric layer, and a second dielectric layer over the top source/drain feature, forming a frontside opening through the second dielectric layer to expose a portion of the top source/drain feature, selectively depositing a first silicide layer on the exposed portion of the top source/drain feature, forming a top metal fill layer over the first silicide layer to fill the frontside opening, forming a backside opening through the substrate to expose a portion of the bottom source/drain feature, selectively depositing a second silicide layer on the exposed portion of the bottom source/drain feature, and forming a bottom metal fill layer on the second silicide layer.

20 Claims, 22 Drawing Sheets

(51) Int. Cl.
| | |
|---|---|
| *H01L 27/092* | (2006.01) |
| *H01L 29/06* | (2006.01) |
| *H01L 29/423* | (2006.01) |
| *H01L 29/49* | (2006.01) |
| *H01L 29/66* | (2006.01) |
| *H01L 29/775* | (2006.01) |
| *H01L 29/78* | (2006.01) |
| *H01L 29/786* | (2006.01) |
| *H10D 30/01* | (2025.01) |
| *H10D 30/43* | (2025.01) |
| *H10D 30/62* | (2025.01) |
| *H10D 30/67* | (2025.01) |
| *H10D 62/10* | (2025.01) |
| *H10D 64/66* | (2025.01) |
| *H10D 84/01* | (2025.01) |
| *H10D 84/03* | (2025.01) |
| *H10D 84/85* | (2025.01) |

(52) U.S. Cl.
CPC ......... *H10D 30/43* (2025.01); *H10D 30/6211* (2025.01); *H10D 30/6219* (2025.01); *H10D 30/6735* (2025.01); *H10D 30/6757* (2025.01); *H10D 62/121* (2025.01); *H10D 64/665* (2025.01); *H10D 64/668* (2025.01); *H10D 84/017* (2025.01); *H10D 84/0193* (2025.01); *H10D 84/038* (2025.01); *H10D 84/853* (2025.01)

(58) Field of Classification Search
CPC ........... H10D 30/6212; H10D 30/6213; H10D 30/6219; H10D 30/6711; H10D 30/6713; H10D 30/6735; H10D 30/6757; H10D 30/797; H10D 62/021; H10D 62/118; H10D 62/119; H10D 62/121; H10D 62/149; H10D 62/151; H10D 64/665; H10D 64/668; H10D 84/013; H10D 84/0158; H10D 84/017; H10D 84/0193; H10D 84/032; H10D 84/834; H10D 84/853

See application file for complete search history.

(56) References Cited

U.S. PATENT DOCUMENTS

| | | | |
|---|---|---|---|
| 2022/0384435 A1* | 12/2022 | Chen | H10D 84/038 |
| 2023/0377998 A1* | 11/2023 | Smith | H01L 23/5286 |
| 2024/0072116 A1* | 2/2024 | Xie | H10D 62/121 |
| 2024/0290866 A1* | 8/2024 | Hong | H10D 84/0149 |

* cited by examiner

SELECTIVE SILICIDE FOR STACKED MULTI-GATE DEVICE

PRIORITY DATA

The present application claims the benefit of U.S. Provisional Application No. 63/487,667, filed Mar. 1, 2023, the entirety of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the semiconductor industry further progresses into advanced technology process nodes in pursuit of higher device density, higher performance, and lower costs, challenges from both fabrication and design issues have led to stacked device structure configurations, such as complementary field effect transistors (C-FET).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
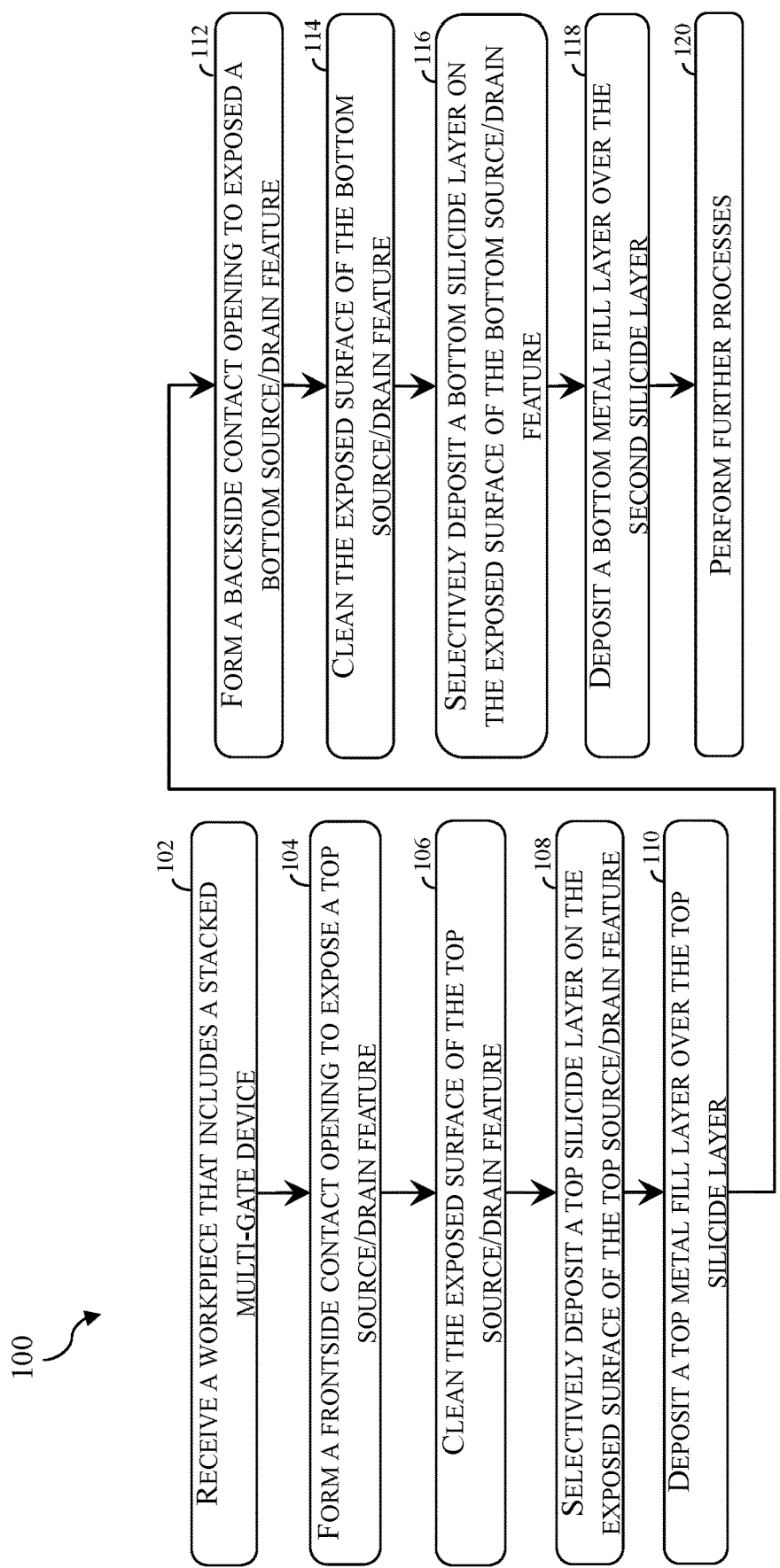
FIG. 1 illustrates a flow chart of a method for forming low-resistance source/drain contacts for a C-FET structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

A stacked multi-gate device refers to a semiconductor device that includes a first multi-gate device and a second multi-gate device stacked over the first multi-gate device. When the first multi-gate device and the second multi-gate device are of different conductivity types, the stacked multi-gate device may be a complementary field effect transistor (C-FET). The multi-gate devices in a C-FET may be FinFETs or MBC transistors. The vertical stacking creates challenges for formation of source/drain features. In some instances, a contact feature may extend through a top source/drain feature to contact a bottom source/drain feature. This creates concerns in increase of contact resistance as the longer source/drain contact features and small contact areas may increase contact resistance. In some existing schemes, source/drain contacts interface n-type and p-type source/drain features by way of the same type of metal silicide features. The industry has not come up with a single kind of metal silicide that can reduce contact resistance to source/drain features of different conductivity types.

The present disclosure provides process to allow source/drain contacts to interface with p-type source/drain features and n-type source/drain features by way of different metal silicide layers to reduce contact resistance. An n-type source/drain feature may include silicon and an n-type dopant and a p-type source/drain feature may include silicon germanium and a p-type dopant. In one embodiment, a frontside contact opening is formed to expose a top source/drain feature of a first type and a backside contact opening is formed to expose a bottom source/drain feature of a second type. Different metal silicide layers are formed in the frontside contact opening and the backside contact opening. In another embodiment, a frontside contact opening is formed to expose both a bottom source/drain feature and a top source/drain feature. A first metal silicide layer including molybdenum silicide and molybdenum germanide is selectively deposited on a p-type source/drain feature. After the selective deposition of the first metal silicide layer, a second metal silicide layer is globally deposited on the first metal silicon layer and n-type source/drain features. Because the first metal silicide layer helps reduce contact resistance between the first metal silicide layer and the p-type source/drain feature and the second metal silicide layer helps reduce contact resistance between the second metal silicide layer and n-type source/drain feature, contact resistance reduction is achieved with source/drain features of both types.

The various aspects of the present disclosure will now be described in more detail with reference to the figures. In that regard, FIGS. 1 and 14 are flowcharts illustrating methods 100 and 300 for forming low-resistance source/drain contacts in a stacked multi-gate structure. Methods 100 and 300 are merely examples and are not intended to limit the present disclosure to what is explicitly illustrated in method 100 or 300. Additional steps may be provided before, during and after method 100 or method 300, and some steps described can be replaced, eliminated, or moved around for additional embodiments of the method. Not all steps are described herein in detail for reasons of simplicity. Method 100 is described below in conjunction with FIGS. 2-13, which are fragmentary cross-sectional views of a workpiece 200 at different stages of fabrication according to embodiments of method 100. Method 300 is described below in conjunction with FIGS. 2-3 and 15-22, which are fragmentary cross-sectional views of a workpiece 200 at different stages of fabrication according to embodiments of method 300. Because the workpiece 200 will be fabricated into a semiconductor structure 200 upon conclusion of the fabrication processes, the workpiece 200 may be referred to as the semiconductor structure 200 as the context requires. Additionally, throughout the present application, like reference numerals denote like features, unless otherwise excepted.

Method 100 shown in FIG. 1 is directed to an example process flow where a frontside contact opening is formed to expose an upper source/drain feature and a backside contact opening is formed to expose a lower source/drain feature. The different openings are utilized to form different silicide features to interface different types of source/drain features, thereby to reduce contact resistance.

Figure 2:
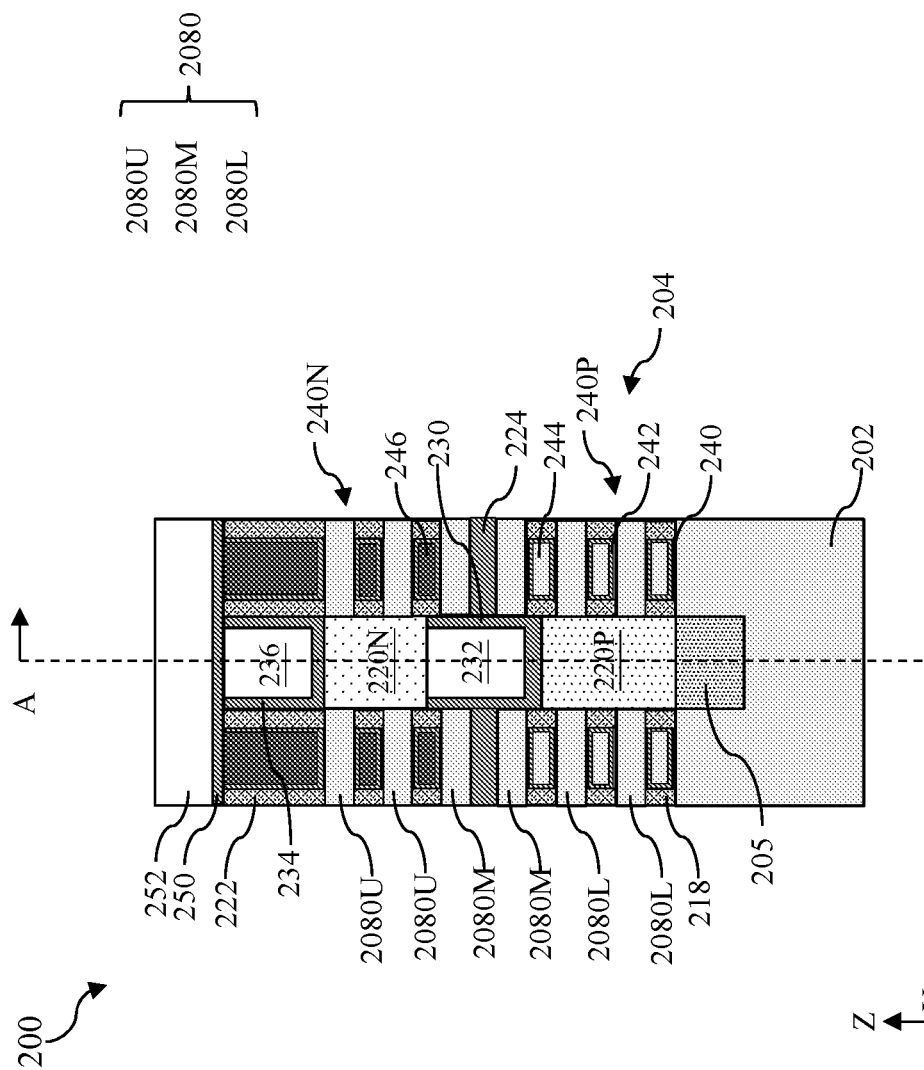
FIGS. 2-13 illustrate fragmentary cross-sectional views of a workpiece undergoing various fabrication processes in the method of FIG. 1, according to one or more aspects of the present disclosure.
Figure 3:
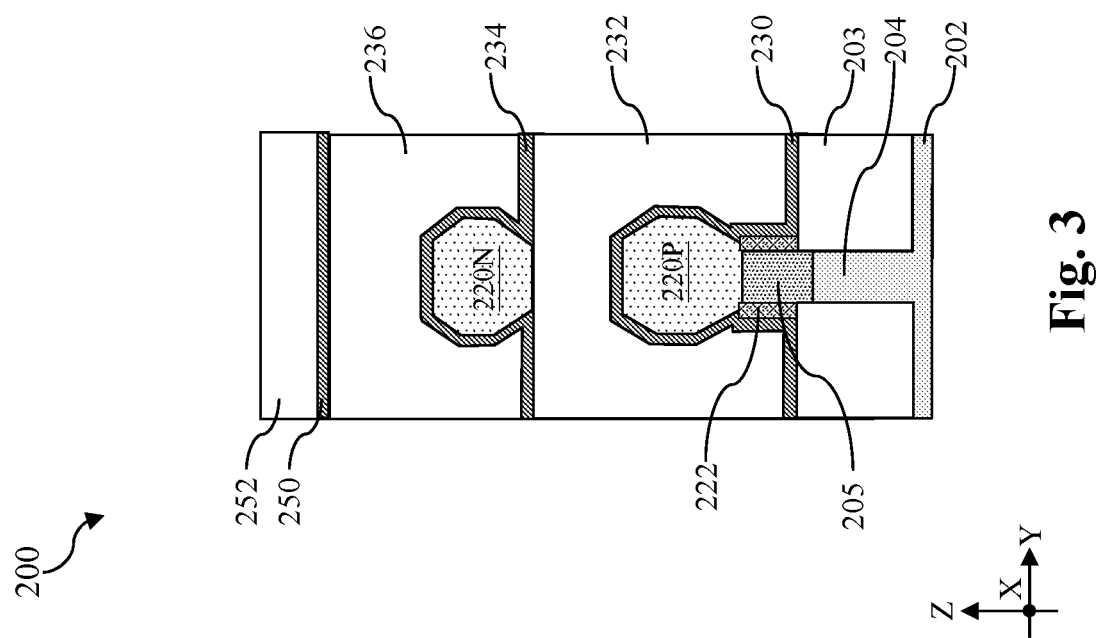

Referring FIGS. 1, 2 and 3, method 100 includes a block 102 where a workpiece 200 is provided. As shown in FIGS. 2 and 3, the workpiece 200 includes a stacked multi-gate device structure formed on a substrate 202. In the depicted embodiment, the stacked multi-gate device structure is a C-FET structure. The substrate 202 may include an elementary (single element) semiconductor, such as silicon (Si), germanium (Ge), and/or other suitable materials; a compound semiconductor (i.e., alloy semiconductor), such as silicon carbide (SiC), gallium arsenic (GaAs), gallium phosphide (GaP), indium phosphide (InP), indium arsenide (InAs), indium antimonide (InSb), silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), gallium indium phosphide (GaInAsP), and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a buried silicon oxide (BOX) layer. In another example, the substrate 202 may include one or more semiconductor layers that are deposited epitaxially on the substrate 202. In some embodiments, the substrate 202 includes various doped regions, such as n-type wells or p-type wells. The doped regions may be doped with n-type dopants, such as phosphorus (P) or arsenic (As), and/or p-type dopants, such as boron (B) or $BF_2$, depending on design requirements. Doped regions may be formed by implantation of dopant atoms, in-situ doped epitaxial growth, and/or other suitable techniques. In the depicted embodiments, the substrate 202 is a silicon (Si) substrate.

Referring to FIGS. 2 and 3, the workpiece 200 includes an active region extending lengthwise along the X direction and gate structures (including top gate structures 240N and bottom gate structures 240P) extending lengthwise along the Y direction. FIG. 3 illustrates an X direction cross-sectional view along line A-A' in FIG. 2. Referring to FIGS. 2 and 3, a portion of the substrate 202 is patterned into a fin structure 204. The fin structure 204 rises continuously from the substrate 202 and is surrounded by an isolation feature 203. The isolation feature 203 may include silicon oxide. A plurality of channel members 2080 are disposed over a channel region of the fin structure 204. The active region includes a plurality of channel members 2080, including lower channel members 2080L, middle channel members 2080M, and upper channel members 2080U. Like the fin structure 204, the plurality of channel members 2080 extend lengthwise along X direction. As used herein, the active region includes the fin structure 204 and the channel members 2080. Along the Z direction, the plurality of the channel members 2080 are interleaved by inner spacer features 218. In some embodiments, the inner spacer features 218 include a dielectric material, such as silicon oxide, silicon nitride, silicon oxycarbide, silicon oxycarbonitride, silicon carbonitride, metal nitride, or a combination thereof. Depending on the dimensions and the shapes, the channel members 2080 may also be referred to as nanostructures, nanosheets, or nanowires. In the depicted embodiments, the lower channel members 2080L serve as a channel of a bottom multi-gate device and the upper channel members 2080U serve as a channel of a top multi-gate device. The middle channel members 2080M are vertically spaced apart by a middle dielectric layer 224 and, as described below, are disabled.

The workpiece 200 also includes a bottom gate structure 240P and a top gate structure 240N. As shown in FIG. 2, the bottom gate structure 240P wraps around each of the lower channel members 2080L and the top gate structure 240N wraps around each of the upper channel members 2080U. Each of the bottom gate structure 240P and the top gate structure 240N includes an interfacial layer 240 to interface the channel members, a gate dielectric layer 242 over the interfacial layer 240, and at least one work function layer. In some embodiments, the interfacial layer 240 includes silicon oxide and may be formed on semiconductor surfaces (such as silicon surfaces) in a pre-clean process. An example pre-clean process may include use of RCA SC-1 (ammonia, hydrogen peroxide and water) and/or RCA SC-2 (hydrochloric acid, hydrogen peroxide and water). The gate dielectric layer 242 may be formed of high-K dielectric materials and may be deposited using atomic layer deposition (ALD) or chemical vapor deposition (CVD). As used and described herein, high-k dielectric materials include dielectric materials having a high dielectric constant, for example, greater than that of thermal silicon oxide (~3.9). In one embodiment, the gate dielectric layer 242 includes hafnium oxide. Alternatively, the gate dielectric layer 242 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. In some embodiments, the middle dielectric layer 224 is formed along with the gate dielectric layer 242 and shares the same composition with the gate dielectric layer 242. In some other embodiments, the middle dielectric layer 224 may share the same composition with the inner spacer features 218. It is noted that neither the bottom gate structure 240P and the top gate structure 240N extends between the two middle channel members 2080M due to presence of the middle dielectric layer 224. Sidewalls of the portion of the top gate structure 240N above the upper channel members 2080U are lined by a gate spacer 222. The gate spacer 222 may be a single layer or a multilayer. In some instances, the gate spacer 222 includes silicon nitride, silicon oxycarbonitride, silicon oxynitride, or silicon carbonitride.

In the depicted embodiments, the bottom gate structure 240P is a p-type gate structure and the top gate structure 240N is an n-type gate structure. In these embodiments, the bottom gate structure 240P and the top gate structure 240N have different work function layer compositions. In some embodiments, the bottom gate structure 240P includes at least one p-type work function layer 244 and the top gate structure 240N includes at least one n-type work function layer 246. Example p-type work function layer materials include titanium nitride (TiN), tantalum nitride (TaN), ruthenium (Ru), molybdenum (Mo), tungsten nitride (WN), zirconium silicide (ZrSi2), molybdenum silicide (MoSi2), tantalum silicide (TaSi2), nickel silicide (NiSi2), other p-type work function material, or combinations thereof. Example n-type work function layer materials include titanium (Ti), aluminum (Al), silver (Ag), manganese (Mn), zirconium (Zr), titanium aluminum (TiAl), titanium aluminum carbide (TiAlC), tantalum carbide (TaC), tantalum carbonitride (TaCN), tantalum silicide nitride (TaSiN), tantalum aluminum (TaAl), tantalum aluminum carbide (TaAlC), titanium aluminum nitride (TiAlN), other n-type work function material, or combinations thereof.

As shown in FIG. 2, sidewalls of the lower channel members 2080L are in contact with the p-type source/drain feature 220P. Sidewalls of the upper channel members 2080U are in contact with n-type source/drain feature 220N. Due to their relative locations, the p-type source/drain feature 220P may be referred to as a bottom source/drain feature 220P and the n-type source/drain feature 220N may be referred to as a top source/drain feature 220N. In some embodiments, the p-type source/drain feature 220P includes silicon germanium (SiGe) and a p-type dopant, such as boron (B) or boron difluoride ($BF_2$) and the n-type source/drain feature 220N includes silicon (Si) and an n-type dopant, such as phosphorus (P). The p-type source/drain feature 220P and the n-type source/drain feature 220N are deposited using epitaxial deposition methods, such as vapor-phase epitaxy (VPE), ultra-high vacuum chemical vapor deposition (UHV-CVD), molecular beam epitaxy (MBE). For that reasons, the p-type source/drain feature 220P may be referred to as a p-type source/drain feature 220P and the n-type source/drain feature 220N may be referred to as an n-type source/drain feature 220N. In the depicted embodiments, the p-type source/drain feature 220P are not deposited directly on the substrate 202 to reduce bulk leakage. Instead, the p-type source/drain features 220P are spaced apart from the substrate 202 by a leakage block layer 205. In some embodiments, the leakage block layer 205 includes undoped semiconductor material, such as undoped silicon, undoped germanium, or undoped silicon germanium. In some other embodiments, the leakage block layer 205 includes a dielectric material, such as silicon oxide or silicon nitride. When the leakage block layer 205 is formed of semiconductor materials, it may be deposited using epitaxial deposition method, such as vapor-phase epitaxy (VPE), ultra-high vacuum chemical vapor deposition (UHV-CVD), molecular beam epitaxy (MBE). When the leakage block layer 205 is formed of a dielectric material, it may be deposited using chemical vapor (CVD) deposition or a suitable deposition method.

Reference is made to FIGS. 2 and 3. The workpiece 200 includes a lower contact etch stop layer (CESL) 230 and a lower interlayer dielectric (ILD) layer 232 over the p-type source/drain feature 220P. The workpiece 200 also includes an upper CESL 234 over the n-type source/drain feature 220N and an upper ILD layer 236 over the upper CESL 234. In some embodiments, the lower CESL 230 and the upper CESL 234 include silicon nitride or silicon oxynitride and the lower ILD layer 232 and the upper ILD layer 236 include silicon oxide. As shown in FIG. 3, the lower CESL 230 conformally covers a top surface of the isolation feature 203, sidewalls of the gate spacer 222 disposed along sidewalls of the leakage block layer 205, and exposed surfaces of the p-type source/drain feature 220P. The lower ILD layer 232 fills the gap left behind by the lower CESL 230. The upper CESL 234 conformally covers a top surface of the lower ILD layer 232 and exposed surfaces of the n-type source/drain feature 220N.

Reference is still made to FIGS. 2 and 3. Top surfaces of the gate spacer 222, the top gate structure 240N, the upper CESL 234, and the upper ILD layer 236 are all coplanar, as a result a planarization process. The workpiece 200 further includes an etch stop layer (ESL) 250 on upper ILD layer 236 and an ILD layer 252 on the ESL 250. In some embodiments, the ESL 250 may include silicon nitride or silicon oxynitride and the ILD layer 252 may include silicon oxide.

Figure 4:
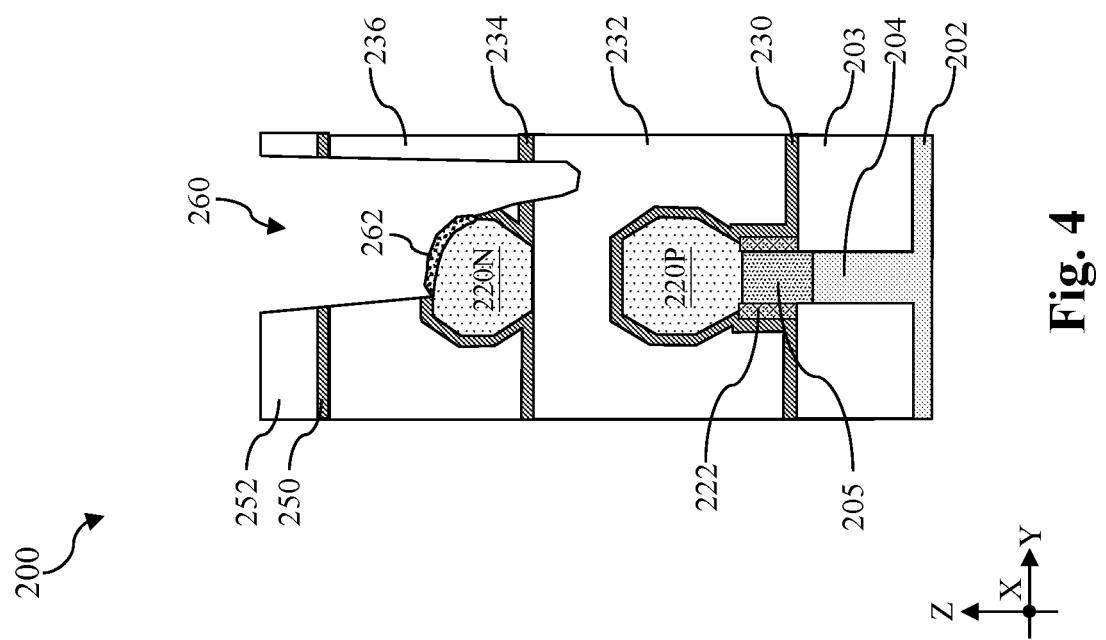

Referring to FIGS. 1 and 4, method 100 includes a block 104 where a frontside contact opening 260 is formed to expose a top source/drain feature 220N. Formation of the frontside contact opening 260 may include use of photolithography and etch processes. In an example process not explicitly illustrated in the drawings, a plurality of hard mask layers are deposited on a front side (i.e., close to the ILD layer 252) of the workpiece 200. The plurality of hard masks may include a tungsten carbide (WC) layer, silicon oxide layer, a silicon nitride layer, or an amorphous silicon (a-Si) layer. Each of the hard mask layers may be deposited using physical vapor deposition (PVD), CVD, ALD, or a suitable deposition method. After the deposition of the plurality of hard mask layers, a photoresist layer is deposited over the workpiece 200 using spin-on coating or flowable CVD (FCVD). To pattern the photoresist layer, the photoresist layer is exposed to radiation reflected from or transmitting through a photomask, baked in a post-exposure bake process, and developed in a developer. The patterned photoresist layer is then applied as an etch mask to etch the plurality of hard mask layers, thereby forming a patterned hard mask. The patterned hard mask is then applied as an etch mask to etch the ILD layer 252, the ESL 250, the upper ILD layer 236, and the upper CESL 234 to form the frontside contact opening 260. The etching of the ILD layer 252, the ESL 250, the upper ILD layer 236, and the upper CESL 234 may include an anisotropic etch process. For example, the anisotropic etch process may be a reactive-ion etching (RIE) process that includes use of a bromine-containing gas (e.g., HBr and/or $CHBr_3$), a fluorine-containing gas (e.g., $CF_4$, $SF_6$, $NF_3$, $CH_2F_2$, $CHF_3$, and/or $C_2F_6$), a carbon-containing gas (e.g., $CH_4$ or $C_2H_6$), other suitable gases, or combinations thereof. As shown in FIG. 4, the etching at block 104 may continue through the upper CESL 234 such that the frontside contact opening 260 partially extends into the lower ILD layer 232. Additionally, as shown in FIG. 4, the etching at block 104 may also etch a portion of the n-type source/drain feature 220N and forms a surface oxide layer 262. It is noted that the frontside contact opening 260 does not expose any portion of the p-type source/drain features 220P. After the formation of the frontside contact opening 260, the remaining hard mask layers are removed.

Figure 5:
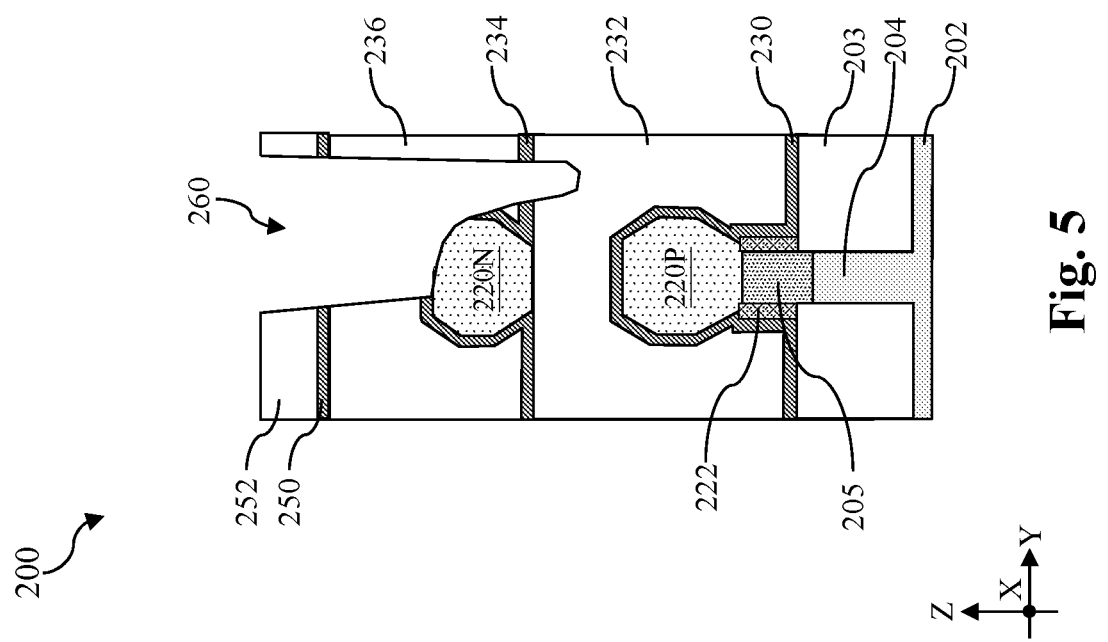

Referring to FIGS. 1 and 5, method 100 includes a block 106 where the exposed surface of the top source/drain feature 220N is cleaned. To prepare the exposed surface of the top source/drain feature 220N for further processing, a dry cleaning process or a wet cleaning process may be performed at block 106 to remove the surface oxide layer 262. An example dry cleaning process may include use of a remotely generated plasma of $H_2$, $NF_3$ and $NH_3$. An example wet cleaning process may involve use of diluted hydrofluoric acid (DHF) solution to clean the surfaces of the top source/drain feature 220N. As shown in FIG. 5, after the cleaning at block 106, a portion of the n-type source/drain feature 220N is exposed in the frontside contact opening 260. The cleaning at block 106 takes place before the epitaxy processes and may be referred to as a pre-clean process.

Figure 6:
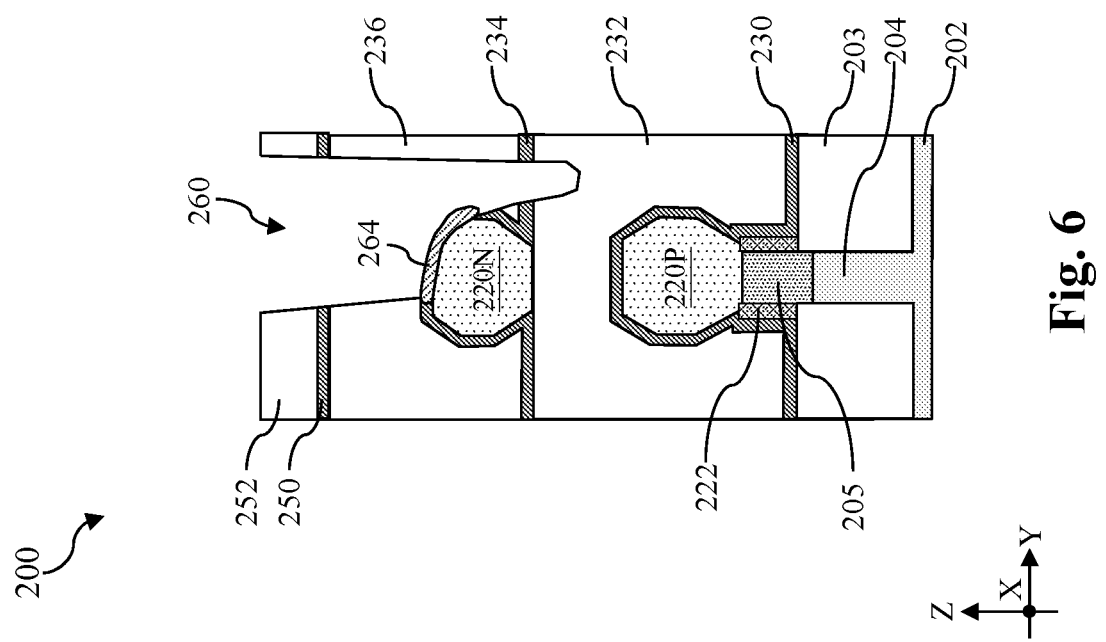

Referring to FIGS. 1 and 6, method 100 includes a block 108 where a first silicide layer 264 is selectively deposited on the exposed surface of the top source/drain feature 220N. As shown in FIG. 6, because the n-type source/drain feature 220N is exposed while the p-type source/drain feature 220P remains covered by the lower ILD layer 232 and the lower CESL 230, at block 108, the first silicide layer 264 is only selectively deposited on the exposed surface of the top source/drain feature 220N. For this reason, the first silicide layer 264 is said to be selectively deposited on the exposed surface of the n-type source/drain feature 220N. In some embodiments, the first silicide layer 264 includes titanium silicide (TiSi). In these embodiments, the first silicide layer 264 may be deposited in-situ by CVD using a titanium containing precursor and silicon source gas. An example titanium-containing precursor may include titanium tetrachloride ($TiCl_4$). An example silicon source gas includes silane ($SiH_4$) or disilane ($Si_2H_6$). In some embodiments, the first silicide layer 264 is deposited at a temperature between about 300° C. and about 500° C. and a pressure between about 1 torr and about 100 torr. When the n-type source/drain feature 220N is formed of phosphorus-doped silicon (Si:P), the first silicide layer 264 provides a low-Schottky barrier of about 0.52 eV or lower.

Figure 7:
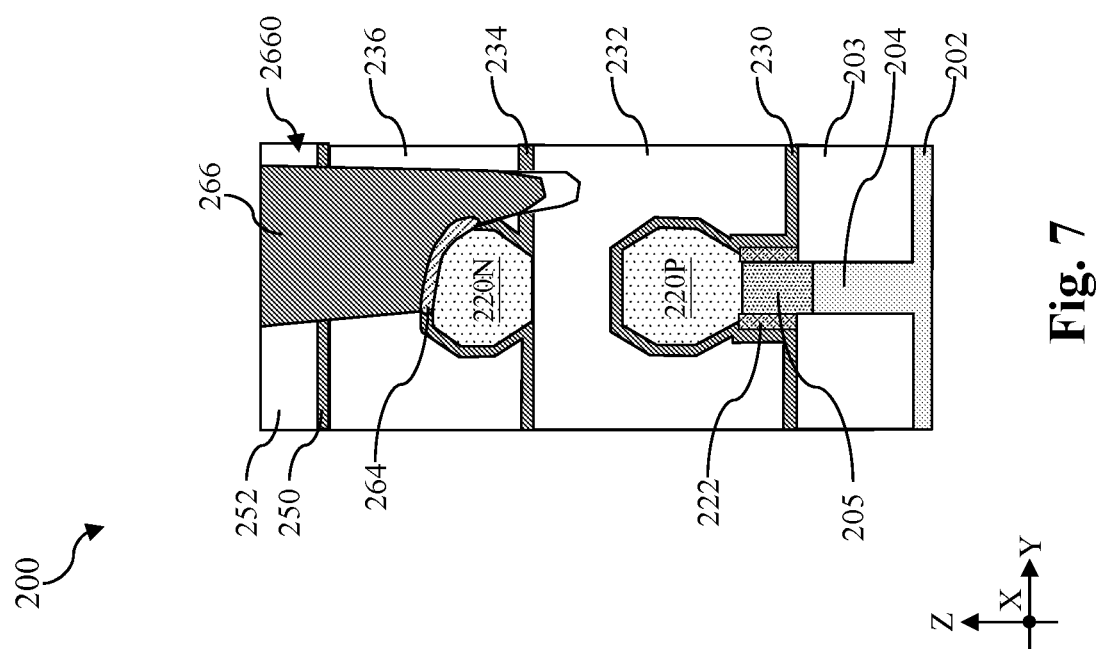

Referring to FIGS. 1 and 7, method 100 includes a block 110 where a top metal fill layer 266 is deposited over the first silicide layer. In some embodiments, the top metal fill layer 266 includes tungsten (W) and is selectively deposited in the frontside contact opening 260, including on the first silicide layer 264. The selective deposition may be a CVD process and may include use of a tungsten-containing precursor, such as tungsten pentachloride ($WCl_5$) and tungsten hexafluoride ($WF_6$), and a reducing agent, such as hydrogen ($H_2$), silane ($SiH_4$), polysilane ($Si_2H_6$ or $Si_3H_8$), diborane ($B_2H_6$), phosphine ($PH_3$), or dichlorosilane ($SiH_2Cl_2$). The selective deposition takes place at a temperature between about 300° C. and about 500° C. and a pressure between about 10 torr and about 500 torr. In some other embodiments, the top metal fill layer 266 may include molybdenum (Mo), ruthenium (Ru), nickel (Ni), or cobalt (Co) and may also be deposited using a selective CVD process. After the deposition of the top metal fill layer 266, the workpiece 200 is planarized to remove excess materials. The planarization may include use of a chemical mechanical polishing (CMP) process. As shown in FIG. 7, after the planarization, a frontside sourced/drain contact 2660 is formed to electrically coupled to the n-type source/drain feature 220N by way of the first silicide layer 264.

Figure 8:
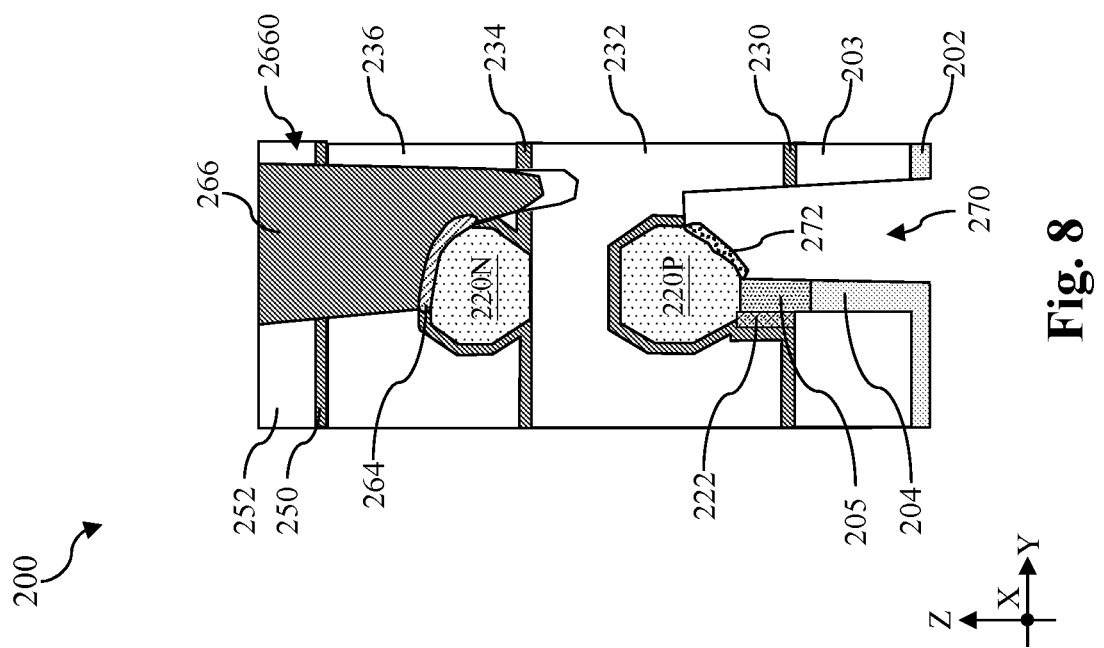

Referring to FIGS. 1 and 8, method 100 includes a block 112 where a backside contact opening 270 is formed to expose a bottom source/drain feature 220P. While not explicitly shown in FIG. 8, operations at block 112 may be performed with the workpiece 200 flipped up upside down. Formation of the backside contact opening 270 may include use of photolithography and etch processes. Before the photolithography and etch processes, the substrate 202 may be ground and polished to a much reduced thickness. In an example process not explicitly illustrated in the drawings, a plurality of hard mask layers are deposited on a back side (i.e., close to the substrate 202) the workpiece 200. The plurality of hard masks may include a tungsten carbide (WC) layer, silicon oxide layer, a silicon nitride layer, or an amorphous silicon (a-Si) layer. Each of the hard mask layers may be deposited using PVD, CVD, ALD, or a suitable deposition method. After the deposition of the plurality of hard mask layers, a photoresist layer is deposited over the back side of the workpiece 200 using spin-on coating or flowable CVD (FCVD). To pattern the photoresist layer, the photoresist layer is exposed to radiation reflected from or transmitting through a photomask, baked in a post-exposure bake process, and developed in a developer. The patterned photoresist layer is then applied as an etch mask to etch the plurality of hard mask layers, thereby forming a patterned hard mask. The patterned hard mask is then applied as an etch mask to etch the substrate 202, the isolation feature 203, the lower CESL 230, and the lower ILD layer 232 to form the backside contact opening 270. The etching of the substrate 202, the isolation feature 203, the lower CESL 230, and the lower ILD layer 232 may include an anisotropic etch process. For example, the anisotropic etch process may be a reactive-ion etching (RIE) process that includes use of a bromine-containing gas (e.g., HBr and/or $CHBr_3$), a fluorine-containing gas (e.g., $CF_4$, $SF_6$, $NF_3$, $CH_2F_2$, $CHF_3$, and/or $C_2F_6$), a carbon-containing gas (e.g., $CH_4$ or $C_2H_6$), other suitable gases, or combinations thereof. As shown in FIG. 8, the etching at block 112 may also etch a portion of the p-type source/drain feature 220P and forms a surface oxide layer 272. Additionally, the backside contact opening 270 extends through a portion of the fin structure 204. It is noted that the backside contact opening 270 does not expose any portion of the n-type source/drain features 220N. After the formation of the backside contact opening 270, the remaining hard mask layers are removed.

Figure 9:
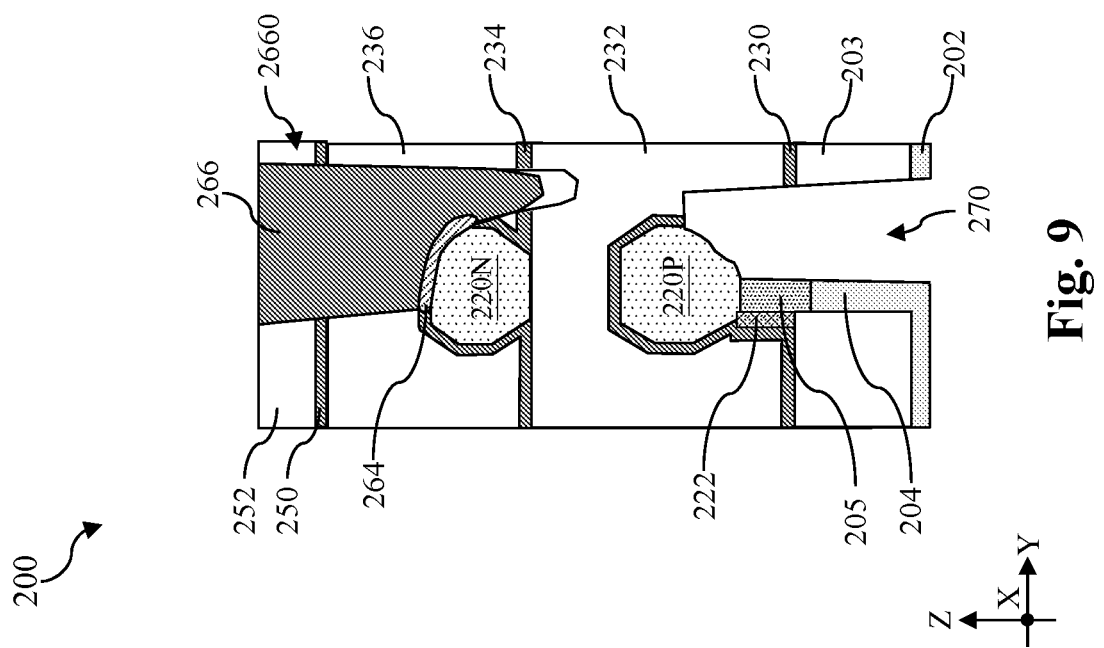

Referring to FIGS. 1 and 9, method 100 includes a block 114 where the exposed surface of the bottom source/drain feature 220P is cleaned. To prepare the exposed surface of the bottom source/drain feature 220P for further processing, a dry cleaning process or a wet cleaning process may be performed at 114 to remove the surface oxide layer 272. An example dry cleaning process may include use of a remotely generated plasma of $H_2$, $NF_3$ and $NH_3$. An example wet cleaning process may involve use of diluted hydrofluoric acid (DHF) solution to clean the surfaces of the bottom source/drain feature 220P. As shown in FIG. 9, after the cleaning at block 114, a portion of the p-type source/drain feature 220P is exposed in the backside contact opening 270. The cleaning at block 114 also takes place before the epitaxy processes and may also be referred to as a pre-clean process.

Figure 10:
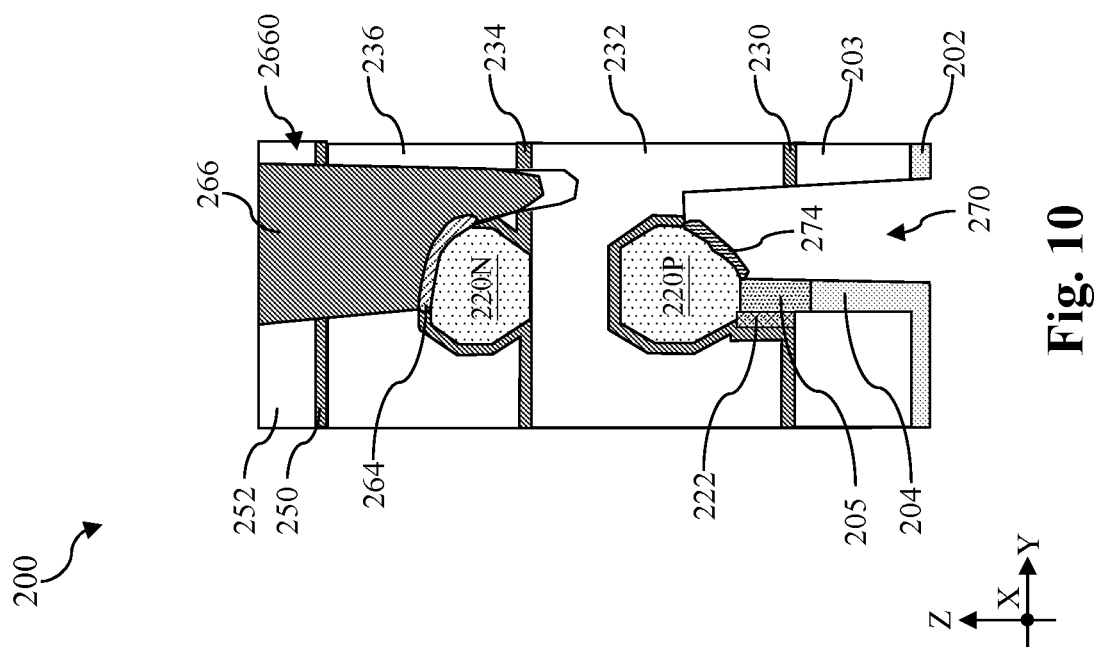

Referring to FIGS. 1 and 10, method 100 includes a block 116 where a second silicide layer 274 is selectively deposited on the exposed surface of the bottom source/drain feature 220P. In some embodiments, the second silicide layer 274 includes molybdenum silicide (MoSi) and molybdenum germanide (MoGe), or molybdenum germosilicide (MoSiGe). In these embodiments, the second silicide layer 274 may be deposited using a selective deposition method, such as ALD, plasma-enhanced ALD (PEALD), CVD, plasma-enhanced CVD (PECVD), or metalorganic CVD (MOCVD). When the second silicide layer 274 includes molybdenum, silicon and germanium, it may be deposited using a molybdenum halide (such as molybdenum chloride ($MoCl_5$) or molybdenum dichloride dioxide ($MoCl_2O_2$)) and hydrogen ($H_2$) at a temperature between about 300° C. and about 500° C. and a pressure between about 10 torr and about 500 torr. At about 300° C. and about 500° C., molybdenum halide absorbs to silicon germanium surface and molybdenum disassociates from the halogen to react with silicon germanium surfaces, thereby forming molybdenum germosilicide (MoSiGe). Because molybdenum halide has higher absorption entropy with dielectric surfaces and silicon surfaces, little molybdenum may be deposited on dielectric surfaces or silicon surfaces. A byproduct of the silicidation reaction, hydrogen chloride, may remove unintended deposition of molybdenum on dielectric surfaces or molybdenum silicide on silicon surfaces. Alternatively, the second silicide layer 274 may include silicide, germanide and/or germosilicide of ruthenium (Ru), nickel (Ni), or cobalt (Co). When the p-type source/drain feature 220P is formed of boron-doped silicon germanium (SiGe:B), the second silicide layer 274 provides a low-Schottky barrier of about 0.3 eV or lower.

Figure 11:
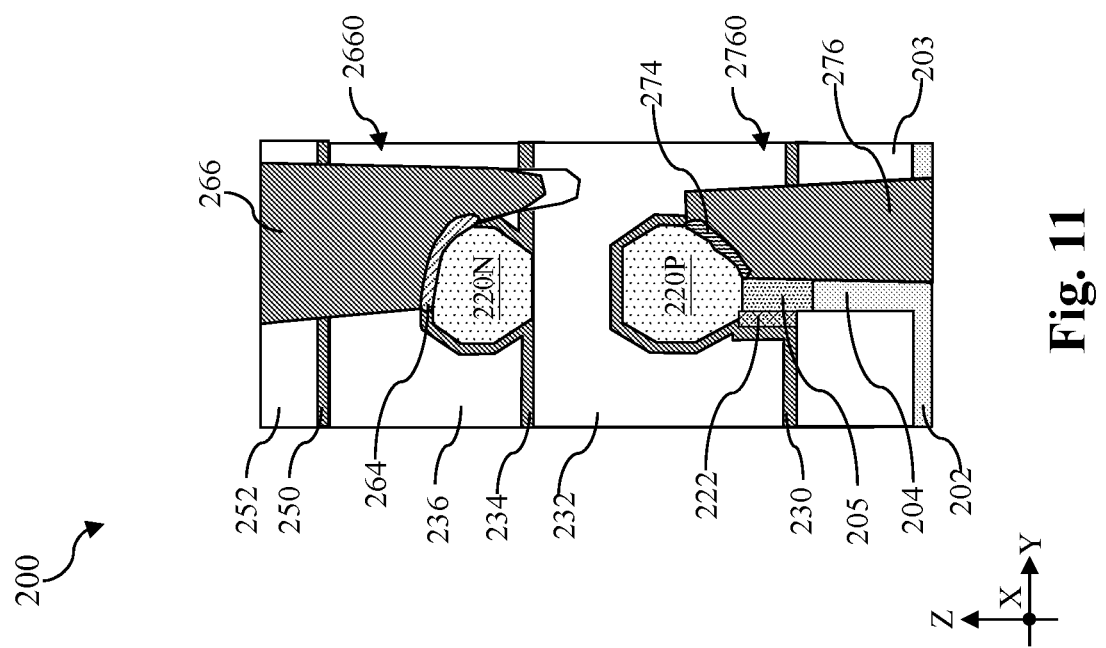

Referring to FIGS. 1 and 11, method 100 includes a block 118, where a bottom metal fill layer 276 is deposited over the second silicide layer 274. In some embodiments, the bottom metal fill layer 276 includes tungsten (W) and is selectively deposited in the backside contact opening 270, including on the second silicide layer 274. The selective deposition may be a CVD process and may include use of a tungsten-containing precursor, such as tungsten pentachloride ($WCl_5$) and tungsten hexafluoride ($WF_6$), and a reducing agent, such as hydrogen ($H_2$), silane ($SiH_4$), polysilane ($Si_2H_6$ or $Si_3H_8$), diborane ($B_2H_6$), phosphine ($PH_3$), or dichlorosilane ($SiH_2Cl_2$). The selective deposition takes place at a temperature between about 300° C. and about 500° C. and a pressure between about 10 torr and about 500 torr. In some other embodiments, the bottom metal fill layer 276 may include molybdenum (Mo), ruthenium (Ru), nickel (Ni), or cobalt (Co) and may also be deposited using a selective CVD process. After the deposition of the bottom metal fill layer 276, the workpiece 200 is planarized to remove excess materials. The planarization may include use of a chemical mechanical polishing (CMP) process. As shown in FIG. 11, after the planarization, a backside sourced/drain contact 2760 is formed to electrically coupled to the p-type source/drain feature 220P by way of the second silicide layer 274.

Figure 12:
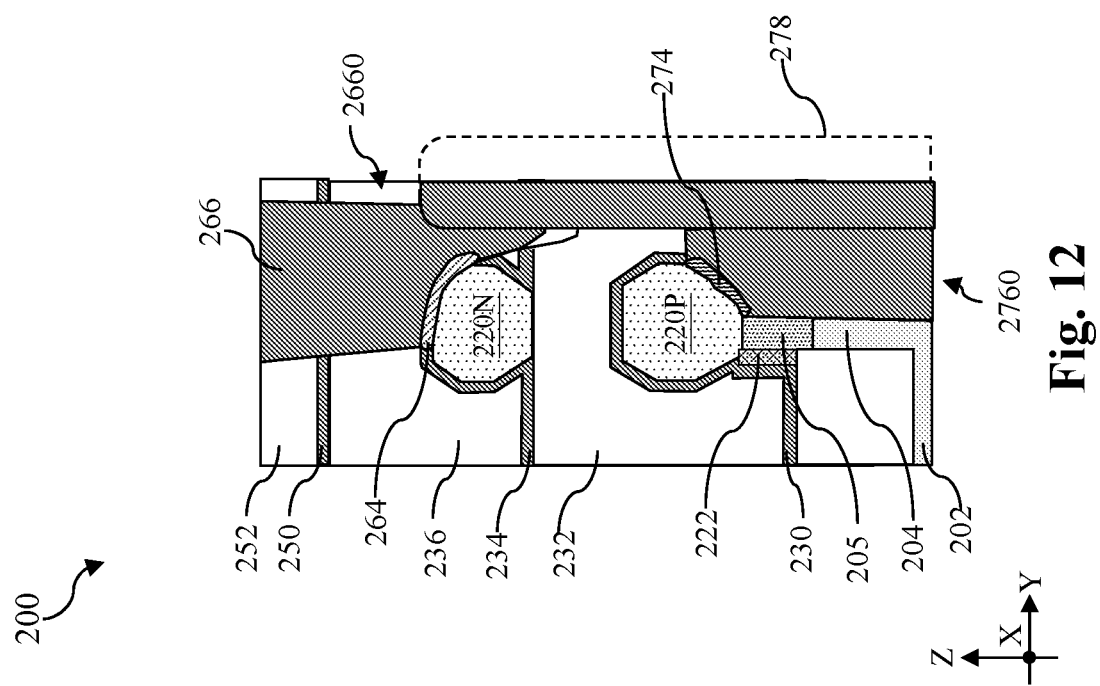
Figure 13:
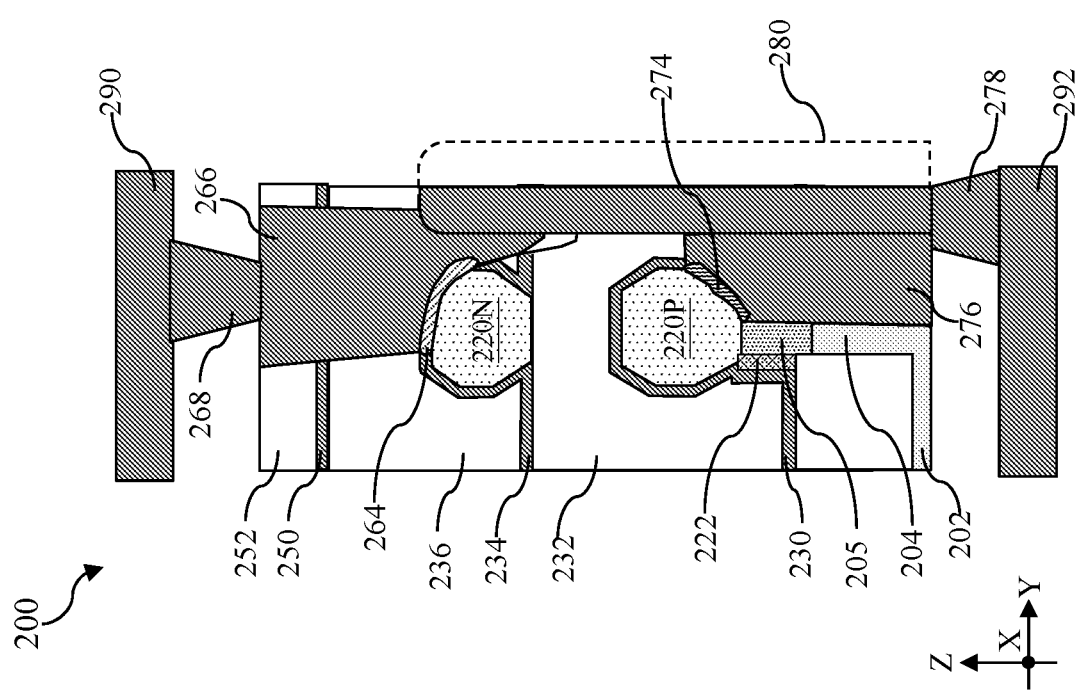
Figure 14:
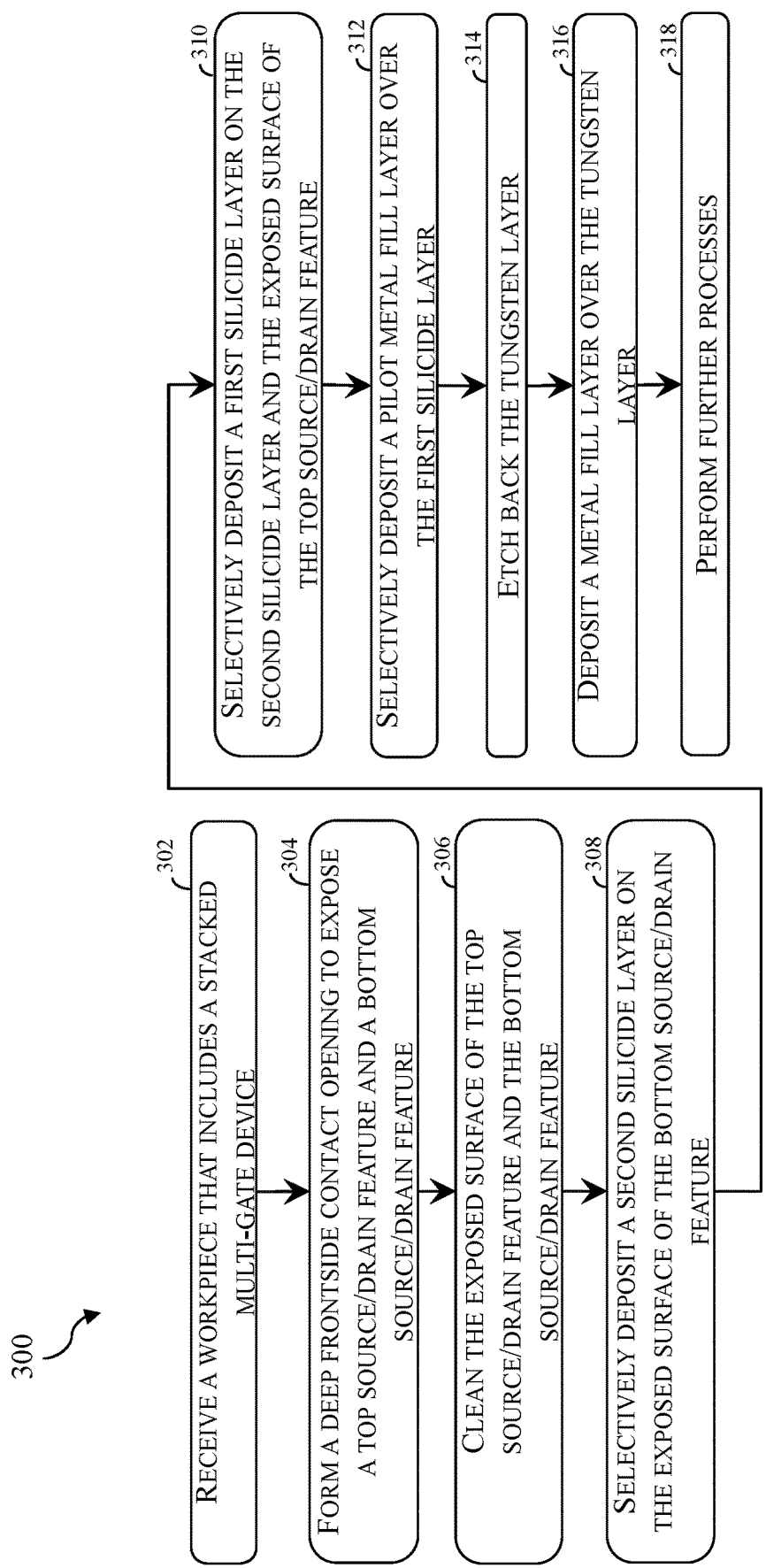
FIG. 14 illustrates a flow chart of a method for selectively depositing a first metal layer on a p-type source/drain feature, according to one or more aspects of the present disclosure.

Referring to FIGS. 1, 12 and 13, method 100 includes a block 120 where further processes are performed. Such further processes may include, for example, formation of a frontside and a backside interconnect structures. The frontside interconnect structure includes at least a frontside via 268 and a frontside line 290. The backside interconnect structure includes at least a backside via 278 and a backside line 292. The frontside via 268 and the backside via 278 may include tungsten (W). I frontside line 290 and the backside line 292 may include copper (Cu).

Method 300 shown in FIG. 14 is directed to another example process flow where a frontside contact opening is formed to expose an upper source/drain feature and a lower source/drain feature. A selective deposition is performed to selectively deposit a second silicide layer to interface the p-type source/drain feature 220P global deposition is performed to blanketly deposit a first silicide layer over the second silicide layer and the n-type source/drain feature 220N. The front side opening is utilized to form different silicide features to interface different types of source/drain features, thereby to reduce contact resistance.

Referring FIGS. 14, 2 and 3, method 300 includes a block 302 where a workpiece 200 is provided. Operations at block 302 are similar to those in block 102. Particularly, the workpiece 200 undergoing method 300 may be the same as the workpiece 200 undergoing method 100. For this reasons, detailed description of the substrate 202 is omitted for brevity.

Figure 15:
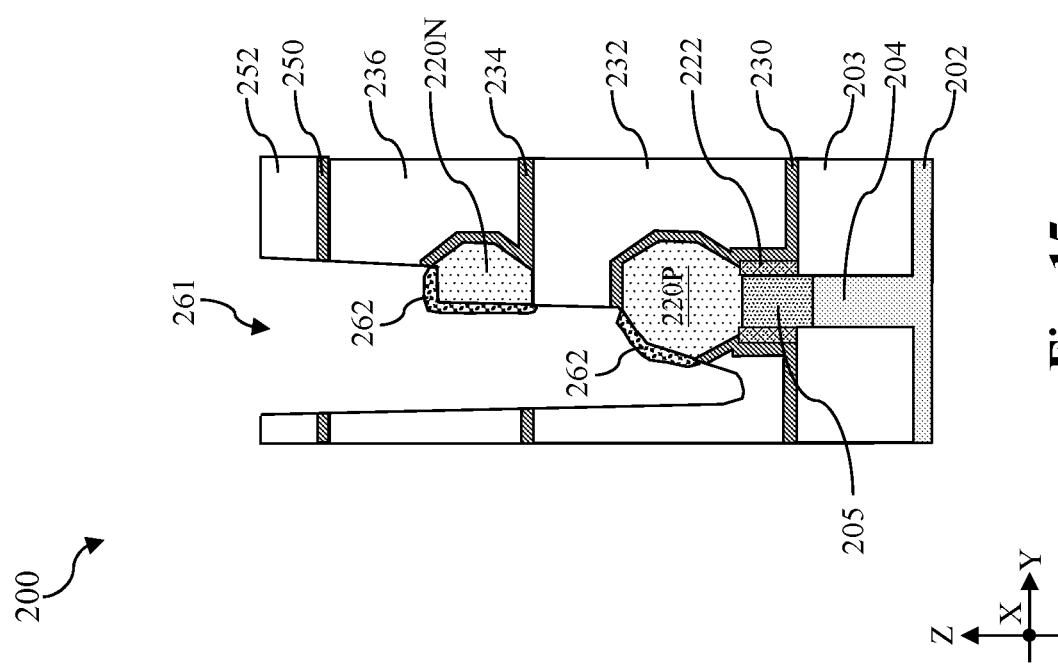
FIGS. 15-22 illustrate fragmentary cross-sectional views of a workpiece undergoing various fabrication processes in the method of FIG. 14, according to one or more aspects of the present disclosure.

Referring to FIGS. 14 and 15, method 100 includes a block 304 where a deep frontside contact opening 261 is formed to expose a bottom source/drain feature 220P and a top source/drain feature 220N. Formation of the deep frontside contact opening 261 may include use of photolithography and etch processes. In an example process not explicitly illustrated in the drawings, a plurality of hard mask layers are deposited on a front side (i.e., close to the ILD layer 252) of the workpiece 200. The plurality of hard masks may include a tungsten carbide (WC) layer, silicon oxide layer, a silicon nitride layer, or an amorphous silicon (a-Si) layer. Each of the hard mask layers may be deposited using physical vapor deposition (PVD), CVD, ALD, or a suitable deposition method. After the deposition of the plurality of hard mask layers, a photoresist layer is deposited over the workpiece 200 using spin-on coating or flowable CVD (FCVD). To pattern the photoresist layer, the photoresist layer is exposed to radiation reflected from or transmitting through a photomask, baked in a post-exposure bake process, and developed in a developer. The patterned photoresist layer is then applied as an etch mask to etch the plurality of hard mask layers, thereby forming a patterned hard mask. The patterned hard mask is then applied as an etch mask to etch the ILD layer 252, the ESL 250, the upper ILD layer 236, the upper CESL 234, the lower ILD layer 232, and the lower CESL 230 to form the deep frontside contact opening 261. The etching of the ILD layer 252, the ESL 250, the upper ILD layer 236, the upper CESL 234, the lower ILD layer 232, and the lower CESL 230 may include an anisotropic etch process. For example, the anisotropic etch process may be a reactive-ion etching (RIE) process that includes use of a bromine-containing gas (e.g., HBr and/or $CHBr_3$), a fluorine-containing gas (e.g., $CF_4$, $SF_6$, $NF_3$, $CH_2F_2$, $CHF_3$, and/or $C_2F_6$), a carbon-containing gas (e.g., $CH_4$ or $C_2H_6$), other suitable gases, or combinations thereof. As shown in FIG. 15, the etching at block 304 may continue until a bottom of the deep frontside contact opening 261 is lower than a bottom surface of the bottom source/drain feature 220P. Additionally, as shown in FIG. 15, the etching at block 304 may also etch a portion of the n-type source/drain feature 220N and the p-type source/drain feature 220P and forms a surface oxide layer 262 on their exposed surfaces. In some embodiments represented in FIG. 15, formation of the deep frontside contact opening 261 may etch the n-type source/drain feature 220N more than the p-type source/drain feature 220P in order for the deep frontside contact opening 261 to reach and expose the p-type source/drain feature 220P. In some alternative embodiments, the deep frontside contact opening 261 may expose sidewalls of the n-type source/drain feature 220N and the p-type source/drain feature 220P, instead of going through a portion of the n-type source/drain feature 220N. After the formation of the deep frontside contact opening 261, the remaining hard mask layers are removed.

Figure 16:
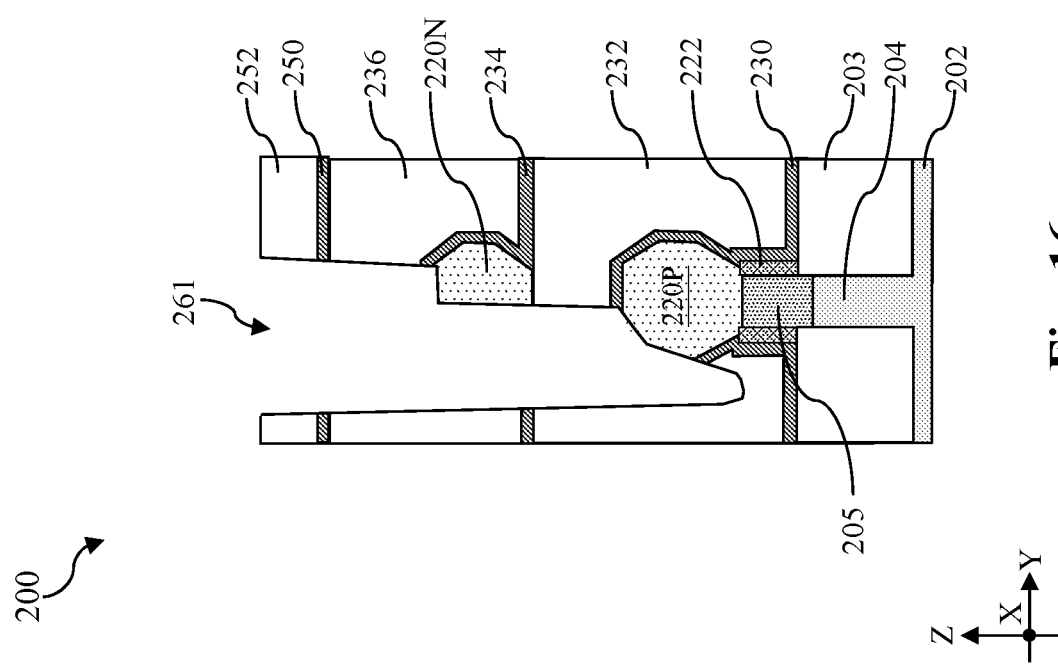

Referring to FIGS. 14 and 16, method 100 includes a block 306 where the exposed surfaces of the top source/drain feature 220N and the bottom source/drain feature 220P are cleaned. To prepare the exposed surfaces of the top source/drain feature 220N and the bottom source/drain feature 220P for further processing, a dry cleaning process or a wet cleaning process may be performed at block 306 to remove the surface oxide layer 262. An example dry cleaning process may include use of a remotely generated plasma of $H_2$, $NF_3$ and $NH_3$. An example wet cleaning process may involve use of diluted hydrofluoric acid (DHF) solution to clean the surfaces of the top source/drain feature 220N and the bottom source/drain feature 220P. As shown in FIG. 16, after the cleaning at block 306, a portion of each of the top source/drain feature 220N and the bottom source/drain feature 220P is exposed in the deep frontside contact opening 261. The cleaning at block 306 takes place before the epitaxy processes and may be referred to as a pre-clean process.

Figure 17:
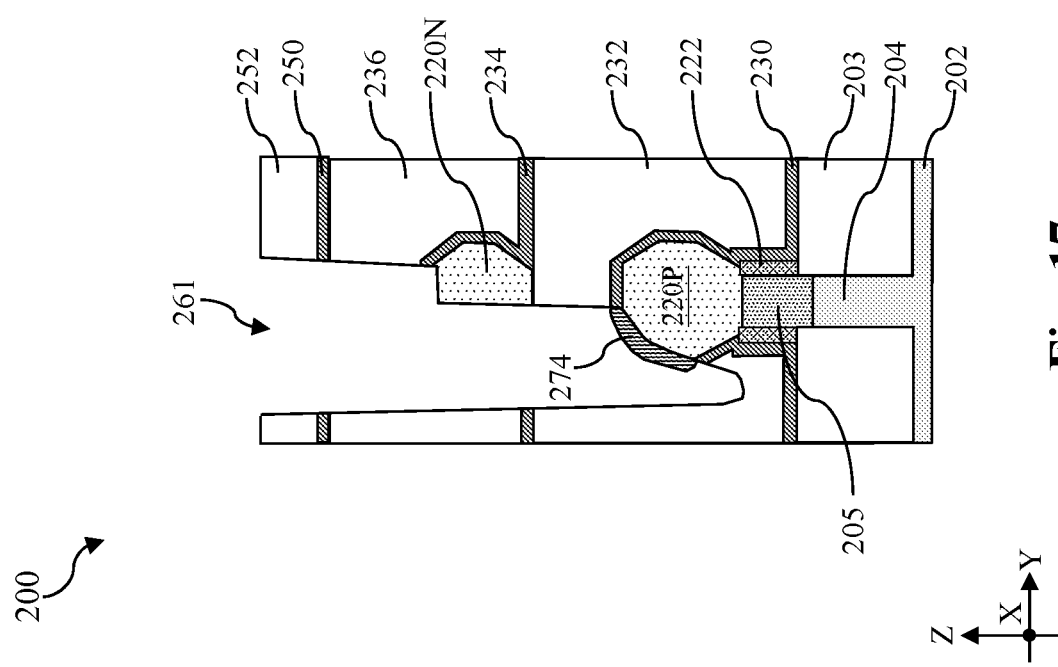

Referring to FIGS. 14 and 17, method 100 includes a block 308 where a second silicide layer 274 is selectively deposited on the exposed surface of the bottom source/drain feature 220P. In some embodiments, the second silicide layer 274 includes molybdenum silicide (MoSi) and molybdenum germanide (MoGe), or molybdenum germosilicide (MoSiGe). In these embodiments, the second silicide layer 274 may be deposited using a selective deposition method, such as ALD, PEALD, CVD, PECVD, or MOCVD. When the second silicide layer 274 includes molybdenum, silicon and germanium, it may be deposited using a molybdenum halide (such as molybdenum chloride ($MoCl_5$) or molybdenum dichloride dioxide ($MoCl_2O_2$)) and hydrogen ($H_2$) at a temperature between about 300° C. and about 500° C. and a pressure between about 10 torr and about 500 torr. At about 300° C. and about 500° C., molybdenum halide absorbs to silicon germanium surface and molybdenum disassociates from the halogen to react with silicon germanium surfaces, thereby forming molybdenum germosilicide (MoSiGe). Because molybdenum halide has higher absorption entropy with dielectric surfaces and silicon surfaces, little molybdenum may be deposited on dielectric surfaces or silicon surfaces. A byproduct of the silicidation reaction, hydrogen chloride, may remove unintended deposition of molybdenum on dielectric surfaces or molybdenum silicide on silicon surfaces. Alternatively, the second silicide layer 274 may include silicide, germanide and/or germosilicide of ruthenium (Ru), nickel (Ni), or cobalt (Co). It is observed that at the temperature between about 300° C. and about 500° C., the deposition rate of the second silicide layer 274 on the bottom source/drain feature 220P is between about 3 times to about 7 times of that of the second silicide layer 274 on the top source/drain feature 220N. While a trace amount of the second silicide layer 274 is deposited on the top source/drain feature 220N, it does not affect the low-Schottky barrier between the first silicide layer 264 (to be described below) and the top source/drain feature 220N.

Figure 18:
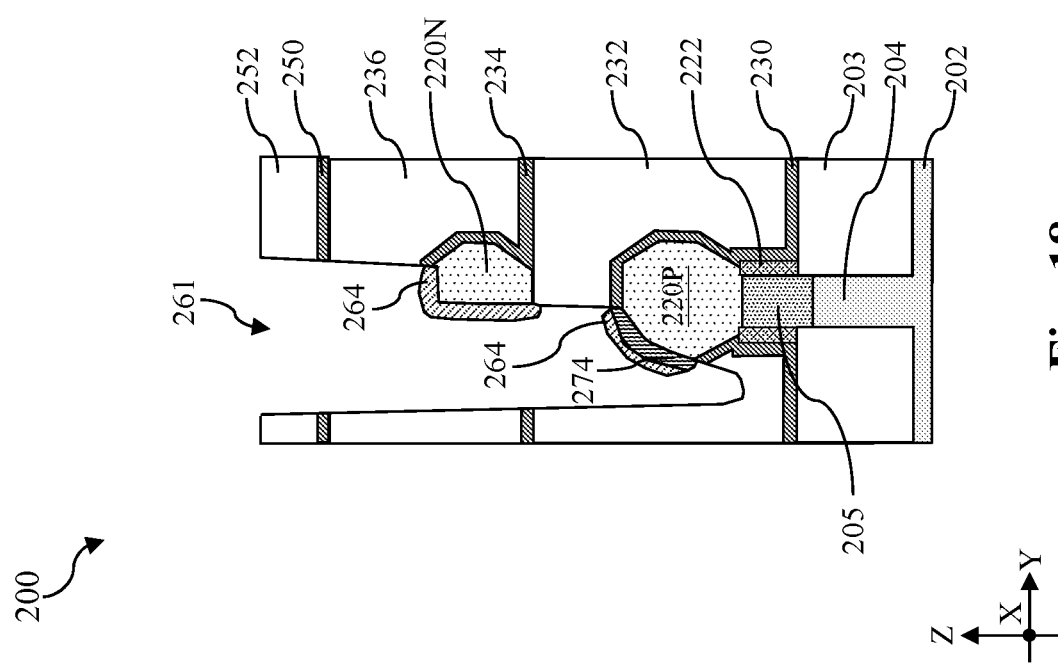

Referring to FIGS. 14 and 18, method 100 includes a block 310 where a first silicide layer 264 is deposited on the second silicide layer 274 and the exposed surface of the top source/drain feature 220N. With the p-type source/drain feature 220P covered by the second silicide layer 274, the first silicide layer 264 is deposited on the exposed surface of the n-type source/drain feature 220N and the second silicide layer 274. In some embodiments, the first silicide layer 264 includes titanium silicide (TiSi). In these embodiments, the first silicide layer 264 may be deposited in-situ by CVD using a titanium containing precursor and silicon source gas. An example titanium-containing precursor may include titanium tetrachloride ($TiCl_4$). An example silicon source gas includes silane ($SiH_4$) or disilane ($Si_2H_6$). In some embodiments, the first silicide layer 264 is deposited at a temperature between about 300° C. and about 500° C. and a pressure between about 1 torr and about 100 torr. When the n-type source/drain feature 220N is formed of phosphorus-doped silicon (Si:P), the first silicide layer 264 provides a low-Schottky barrier of about 0.52 eV or lower.

Figure 19:
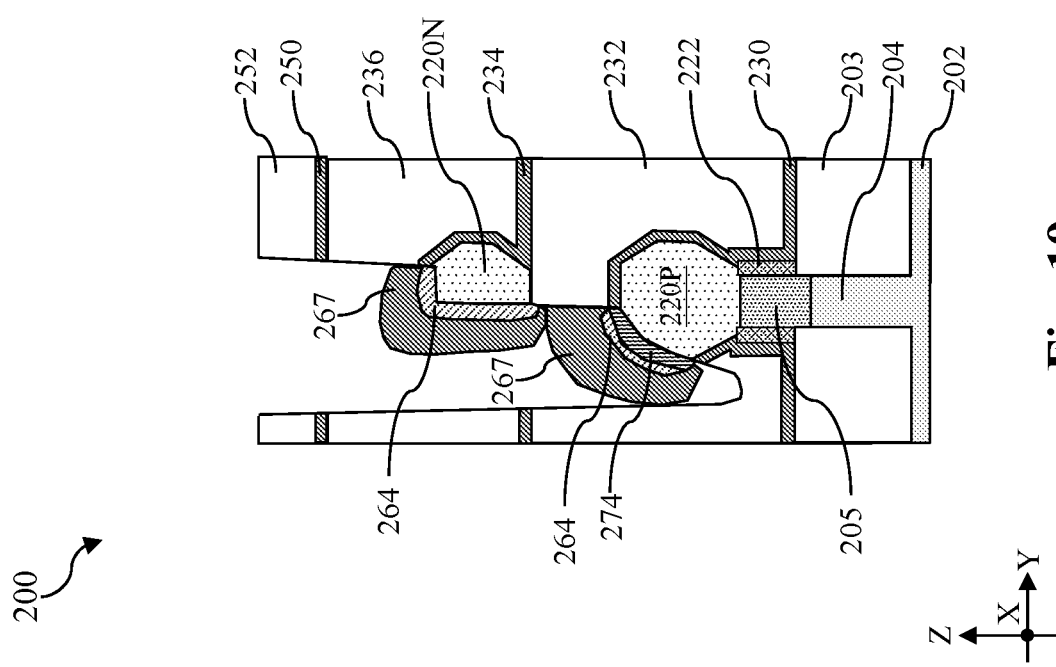

Referring to FIGS. 14 and 19, method 100 includes a block 312 where a pilot metal fill layer 267 is selectively deposited on the first silicide layer 264. In some embodiments, the pilot metal fill layer 267 includes tungsten (W) and is selectively deposited on the exposed surfaces of the first silicide layer 264 and second silicide layer 274. The selective deposition may be a CVD process and may include use of a tungsten-containing precursor, such as tungsten pentachloride ($WCl_5$) and tungsten hexafluoride ($WF_6$), and a reducing agent, such as hydrogen ($H_2$), silane ($SiH_4$), polysilane ($Si_2H_6$ or $Si_3H_8$), diborane ($B_2H_6$), phosphine ($PH_3$), or dichlorosilane ($SiH_2Cl_2$). The selective deposition takes place at a temperature between about 300° C. and about 500° C. In some other embodiments, the pilot metal fill layer 267 may include molybdenum (Mo), ruthenium (Ru), nickel (Ni), or cobalt (Co).

Figure 20:
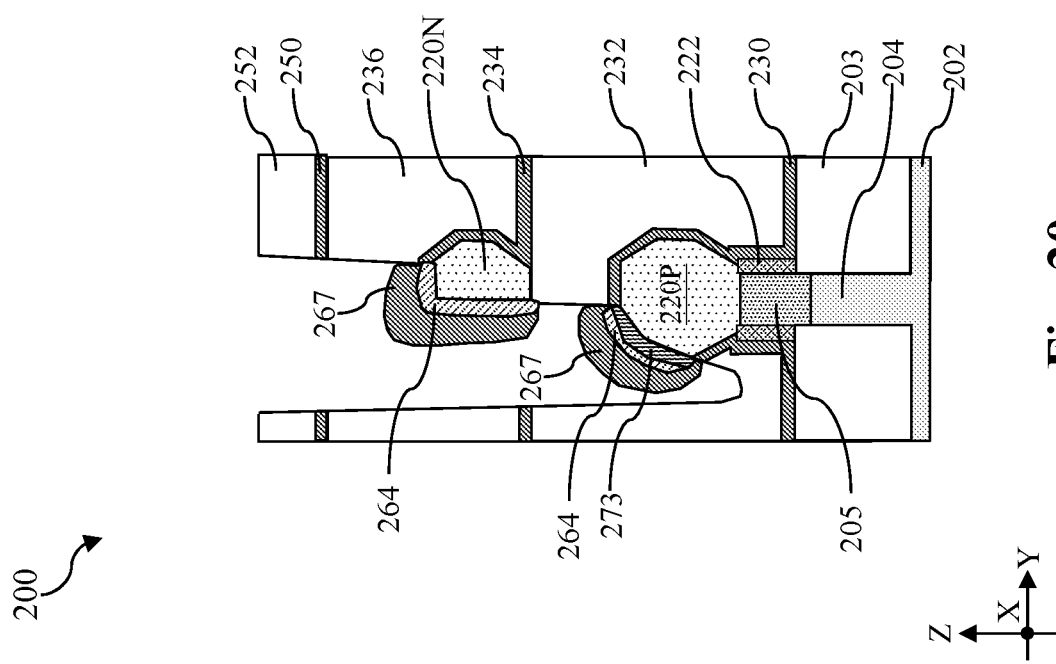

Referring to FIGS. 14 and 20, method 100 includes a block 314 where a pilot metal fill layer 267 is selectively etched back. To ensure that the pilot metal fill layer 267 does not hinder the subsequent deposition of the metal fill layer 269 (to be described below), the deposited pilot metal fill layer 267 is selectively etched backed. The etch back at block 314 may be performed using selective dry etching or selective wet etching. In some embodiments, the pilot metal fill layer 267 may be etched back using a combination of ammonium hydroxide ($NH_4OH$), hydrochloric acid (HCl), deionized (DI) water, and hydrogen peroxide ($H_2O_2$).

Figure 21:
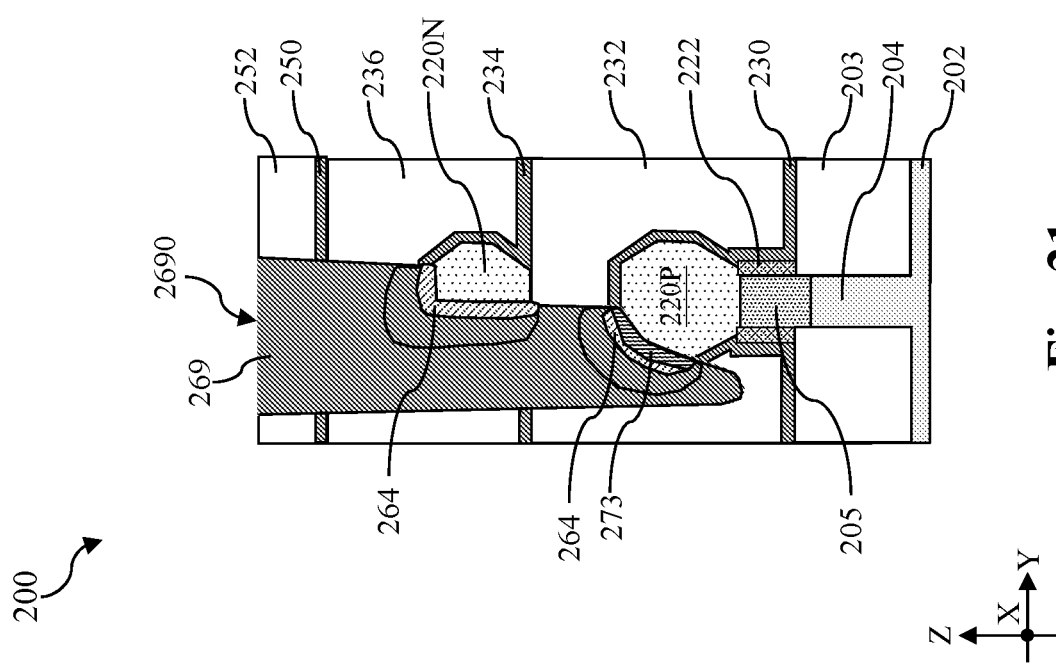

Referring to FIGS. 14 and 21, method 100 includes a block 316 where a metal fill layer 269 is deposited over the pilot metal fill layer 267. In some embodiments, a composition of the metal fill layer 269 is the same as a composition of the pilot metal fill layer 267. In one embodiment, the metal fill layer 269 includes tungsten (W). In other embodiments, the metal fill layer 269 may include molybdenum (Mo), ruthenium (Ru), nickel (Ni), or cobalt (Co). At block 316, the pilot metal fill layer 267 is blanketly deposited in the deep frontside contact opening 261. The blanket deposition may be a CVD process and may include use of a tungsten-containing precursor, such as tungsten pentachloride ($WCl_5$) and tungsten hexafluoride ($WF_6$), and a reducing agent, such as hydrogen ($H_2$), silane ($SiH_4$), polysilane ($Si_2H_6$ or $Si_3H_8$), diborane ($B_2H_6$), phosphine ($PH_3$), or dichlorosilane ($SiH_2Cl_2$). The blanket deposition takes place at a temperature between about 300° C. and about 500° C. After the deposition of the metal fill layer 269, the workpiece 200 is planarized to remove excess materials. The planarization may include use of a chemical mechanical polishing (CMP) process. As shown in FIG. 21, after the planarization, a deep frontside source/drain contact 2690 is formed to interface the bottom source/drain feature 220P by way of the second silicide layer 274 and the top source/drain feature 220N by way of the first silicide layer 264.

Figure 22:
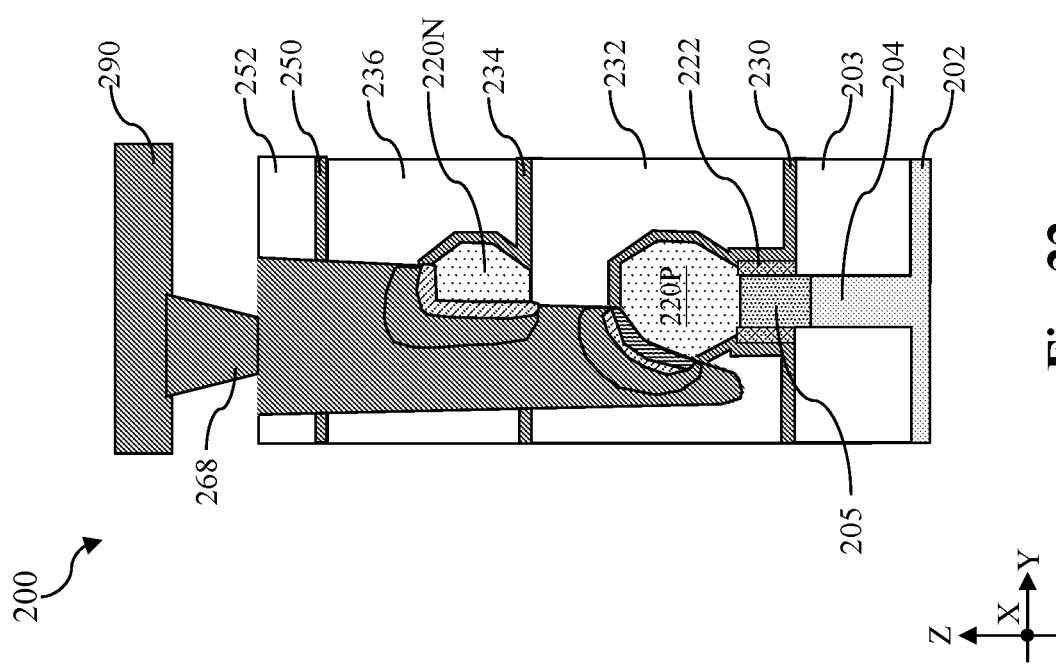

Referring to FIGS. 14 and 22, method 100 includes a block 318 where further processes are performed. Such further processes may include, for example, formation of a frontside interconnect structure. The frontside interconnect structure includes at least a frontside via 268 and a frontside line 290. The frontside via 268 and the frontside line 290 may include copper (Cu).

In one exemplary aspect, the present disclosure is directed to a method. The method includes receiving a workpiece including a bottom source/drain feature over a substrate, a first dielectric layer over the bottom source/drain feature, a top source/drain feature over the first dielectric layer, and a second dielectric layer over the top source/drain feature, forming a frontside opening through the second dielectric layer to expose a portion of the top source/drain feature, selectively depositing a first silicide layer on the exposed portion of the top source/drain feature, after the selectively depositing of the first silicide layer, forming a top metal fill layer over the first silicide layer to fill the frontside opening, forming a backside opening through the substrate to expose a portion of the bottom source/drain feature, selectively depositing a second silicide layer on the exposed portion of the bottom source/drain feature, and after the selectively depositing of the second silicide layer, forming a bottom metal fill layer on the second silicide layer to fill the backside opening. A composition of the first silicide layer is different from a composition of the second silicide layer.

In some embodiments, the bottom source/drain feature includes silicon germanium and a p-type dopant and the top source/drain feature includes silicon and an n-type dopant. In some implementations, the first silicide layer includes titanium silicide and the second silicide layer includes molybdenum germanide and molybdenum silicide. In some embodiments, the top metal fill layer and the bottom metal fill layer include tungsten. In some implementations, the forming of the frontside opening forms a silicon oxide layer on the exposed surface of the top source/drain feature. In some instances, the method further includes before the selectively depositing of the first silicide layer, performing a cleaning process to remove the silicon oxide layer. In some embodiments, a thickness of the first silicide layer has a thickness smaller than 4 nm. In some embodiments, the forming of the top metal fill layer includes a process temperature between about 300° C. and about 500° C. and a pressure between about 10 torr and about 500 torr.

In another exemplary aspect, the present disclosure is directed to a semiconductor structure. The semiconductor structure includes a substrate, a fin structure arising from the substrate, an isolation feature disposed on the substrate and surrounding the fin structure, an undoped semiconductor layer over the fin structure, a bottom source/drain feature disposed on the undoped semiconductor layer, a first dielectric layer over the bottom source/drain feature, a top source/drain feature disposed on the first dielectric layer, a second dielectric layer over the top source/drain feature, a top source/drain contact extending through the second dielectric layer to electrically couple to the top source/drain feature by way a first silicide layer, and a bottom source/drain contact extending through the substrate, the isolation feature, and the undoped semiconductor layer to electrically coupled to the bottom source/drain feature by way of a second silicide layer. The first silicide layer and the second silicide layer include different silicide compositions.

In some embodiments, the first silicide layer includes titanium silicide. The second silicide layer includes molybdenum silicide and molybdenum germanide. In some embodiments, the top source/drain contact and the bottom source/drain contact include tungsten. In some embodiments, the bottom source/drain contact cuts through a portion of the fin structure. In some implementations, a portion of the top source/drain contact extends into the first dielectric layer. In some instances, the undoped semiconductor layer includes undoped silicon, undoped germanium, or undoped silicon germanium. In some embodiments, the semiconductor structure further includes a backside contact feature that extends through the substrate, the first dielectric layer and the second dielectric layer to electrically couple to the bottom source/drain contact and the top source/drain contact.

In yet another exemplary aspect, the present disclosure is directed to a method. The method includes receiving a workpiece that includes a substrate, a fin structure arising from the substrate, an undoped semiconductor layer over the fin structure, a bottom source/drain feature disposed on the undoped semiconductor layer, a first dielectric layer over the bottom source/drain feature, a top source/drain feature disposed on the first dielectric layer, and a second dielectric layer over the top source/drain feature, forming a frontside opening through the second dielectric layer and the first dielectric layer to form a source/drain contact opening that exposes a first surface of the top source/drain feature and a second surface of the bottom source/drain feature, selectively depositing a first silicide layer on the exposed second surface of the bottom source/drain feature, selectively depositing a second silicide layer on the exposed first surface of the top source/drain feature and the first silicide layer, and forming a contact plug in the source/drain contact opening to couple to the second silicide layer.

In some embodiments, the bottom source/drain feature includes silicon germanium and a p-type dopant and the top source/drain feature includes silicon and an n-type dopant. In some embodiments, the first silicide layer includes molybdenum germanide and molybdenum silicide and the second silicide layer includes titanium silicide. In some embodiments, the forming of the contact plug includes selectively depositing a first tungsten layer on the second silicide layer, etching back the first tungsten layer, after the etching back, depositing a second tungsten layer on the first tungsten layer, and planarizing the workpiece. In some embodiments, the forming of the frontside opening forms a silicon oxide layer on the exposed first surface of the top source/drain feature and the exposed second surface of the bottom source/drain feature and the selectively depositing of the first silicide layer includes selectively removing the silicon oxide layer on the exposed first surface and the exposed second surface.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a workpiece comprising a bottom source/drain feature over a substrate, a first dielectric layer over the bottom source/drain feature, a top source/drain feature over the first dielectric layer, and a second dielectric layer over the top source/drain feature;
    forming a frontside opening through the second dielectric layer to expose a portion of the top source/drain feature;
    selectively depositing a first silicide layer on the exposed portion of the top source/drain feature;
    after the selectively depositing of the first silicide layer, forming a top metal fill layer over the first silicide layer to fill the frontside opening;
    forming a backside opening through the substrate to expose a portion of the bottom source/drain feature;
    selectively depositing a second silicide layer on the exposed portion of the bottom source/drain feature; and
    after the selectively depositing of the second silicide layer, forming a bottom metal fill layer on the second silicide layer to fill the backside opening
    wherein a composition of the first silicide layer is different from a composition of the second silicide layer.

2. The method of claim 1,
    wherein the bottom source/drain feature comprises silicon germanium and a p-type dopant,
    wherein the top source/drain feature comprises silicon and an n-type dopant.

3. The method of claim 2,
    wherein the first silicide layer comprises titanium silicide,
    wherein the second silicide layer comprises molybdenum germanide and molybdenum silicide.

4. The method of claim 1, wherein the top metal fill layer and the bottom metal fill layer comprise tungsten.

5. The method of claim 1, wherein the forming of the frontside opening forms a silicon oxide layer on the exposed surface of the top source/drain feature.

6. The method of claim 5, further comprising:
    before the selectively depositing of the first silicide layer, performing a cleaning process to remove the silicon oxide layer.

7. The method of claim 1, wherein a thickness of the first silicide layer has a thickness smaller than 4 nm.

8. The method of claim 1, wherein the forming of the top metal fill layer comprises:
    a process temperature between about 300° C. and about 500° C.; and
    a pressure between about 10 torr and about 500 torr.

9. A semiconductor structure, comprising:
    a substrate;
    a fin structure arising from the substrate;
    an isolation feature disposed on the substrate and surrounding the fin structure;
    an undoped semiconductor layer over the fin structure;
    a bottom source/drain feature disposed on the undoped semiconductor layer;
    a first dielectric layer over the bottom source/drain feature;
    a top source/drain feature disposed on the first dielectric layer;
    a second dielectric layer over the top source/drain feature;
    a top source/drain contact extending through the second dielectric layer to electrically couple to the top source/drain feature by way a first silicide layer; and
    a bottom source/drain contact extending through the substrate, the isolation feature, and the undoped semiconductor layer to electrically coupled to the bottom source/drain feature by way of a second silicide layer,
    wherein the first silicide layer and the second silicide layer comprise different silicide compositions.

10. The semiconductor structure of claim 9,
    wherein the first silicide layer comprises titanium silicide,
    wherein the second silicide layer comprises molybdenum silicide and molybdenum germanide.

11. The semiconductor structure of claim 9, wherein the top source/drain contact and the bottom source/drain contact comprise tungsten.

12. The semiconductor structure of claim 9, wherein the bottom source/drain contact cuts through a portion of the fin structure.

13. The semiconductor structure of claim 9, wherein a portion of the top source/drain contact extends into the first dielectric layer.

14. The semiconductor structure of claim 9, wherein the undoped semiconductor layer comprises undoped silicon, undoped germanium, or undoped silicon germanium.

15. The semiconductor structure of claim 9, further comprising:
    a backside contact feature that extends through the substrate, the first dielectric layer and the second dielectric layer to electrically couple to the bottom source/drain contact and the top source/drain contact.

16. A method, comprising:
receiving a workpiece comprising:
- a substrate,
- a fin structure arising from the substrate,
- an undoped semiconductor layer over the fin structure,
- a bottom source/drain feature disposed on the undoped semiconductor layer,
- a first dielectric layer over the bottom source/drain feature,
- a top source/drain feature disposed on the first dielectric layer, and
- a second dielectric layer over the top source/drain feature, forming a frontside opening through the second dielectric layer and the first dielectric layer to form a source/drain contact opening that exposes a first surface of the top source/drain feature and a second surface of the bottom source/drain feature;

selectively depositing a first silicide layer on the exposed second surface of the bottom source/drain feature;

selectively depositing a second silicide layer on the exposed first surface of the top source/drain feature and the first silicide layer; and forming a contact plug in the source/drain contact opening to couple to the second silicide layer.

17. The method of claim 16,
wherein the bottom source/drain feature comprises silicon germanium and a p-type dopant,
wherein the top source/drain feature comprises silicon and an n-type dopant.

18. The method of claim 17,
wherein the first silicide layer comprises molybdenum germanide and molybdenum silicide,
wherein the second silicide layer comprises titanium silicide.

19. The method of claim 16, wherein the forming of the contact plug comprises:
selectively depositing a first tungsten layer on the second silicide layer;
etching back the first tungsten layer;
after the etching back, depositing a second tungsten layer on the first tungsten layer; and
planarizing the workpiece.

20. The method of claim 16,
wherein the forming of the frontside opening forms a silicon oxide layer on the exposed first surface of the top source/drain feature and the exposed second surface of the bottom source/drain feature,
wherein the selectively depositing of the first silicide layer comprises selectively removing the silicon oxide layer on the exposed first surface and the exposed second surface.

* * * * *